United States Patent
Brosh et al.

(10) Patent No.: US 9,902,611 B2
(45) Date of Patent: Feb. 27, 2018

(54) MINIATURIZED AND RUGGEDIZED WAFER LEVEL MEMS FORCE SENSORS

(71) Applicant: NextInput, Inc., San Jose, CA (US)

(72) Inventors: Amnon Brosh, Santa Monica, CA (US); Ryan Diestelhorst, San Jose, CA (US); Steven Nasiri, Los Altos Hills, CA (US)

(73) Assignee: NEXTINPUT, INC., Mountain View, CA (US)

( * ) Notice: Subject to any disclaimer, the term of this patent is extended or adjusted under 35 U.S.C. 154(b) by 0 days.

(21) Appl. No.: 15/111,044

(22) PCT Filed: Jan. 13, 2015

(86) PCT No.: PCT/US2015/011144
§ 371 (c)(1),
(2) Date: Jul. 12, 2016

(87) PCT Pub. No.: WO2015/106246
PCT Pub. Date: Jul. 16, 2015

(65) Prior Publication Data
US 2016/0332866 A1    Nov. 17, 2016

Related U.S. Application Data

(60) Provisional application No. 61/926,472, filed on Jan. 13, 2014, provisional application No. 61/937,509, (Continued)

(51) Int. Cl.
*B81B 3/00*    (2006.01)
*B81C 1/00*    (2006.01)
(Continued)

(52) U.S. Cl.
CPC ........ *B81B 3/0056* (2013.01); *B81C 1/00626* (2013.01); *G01L 1/18* (2013.01); *G01L 1/205* (2013.01); *B81B 2201/0292* (2013.01)

(58) Field of Classification Search
CPC ..... B81B 3/0056; B81C 1/00626; G01L 1/18; G01L 1/205
See application file for complete search history.

(56) References Cited

U.S. PATENT DOCUMENTS 4,594,639 A * 6/1986 Kuisma ................. G01L 9/0073
361/283.4
4,658,651 A * 4/1987 Le ......................... G01L 1/2293
29/621.1
(Continued)

FOREIGN PATENT DOCUMENTS

DE  102010012441  9/2011
JP  2004-156937  6/2004
(Continued)

OTHER PUBLICATIONS

Mei, T., et al., "Design and Fabrication of an Integrated Three-Dimensional Tactile Sensor for Space Robotic Applications," Micro Electro Mechanical Systems, MEMS '99, Twelfth IEEE International Conference, Orlando Florida, Jan. 21, 1999, pp. 112-117.
(Continued)

*Primary Examiner* — Ida M Soward
(74) *Attorney, Agent, or Firm* — Meunier Carlin & Curfman LLC (57) ABSTRACT

Described herein is a miniaturized and ruggedized wafer level MEMS force sensor composed of a base and a cap. The sensor employs multiple flexible membranes, a mechanical overload stop, a retaining wall, and piezoresistive strain gauges.

13 Claims, 9 Drawing Sheets

Related U.S. Application Data filed on Feb. 8, 2014, provisional application No. 61/983,553, filed on Apr. 24, 2014, provisional application No. 62/004,264, filed on May 29, 2014.

(51) Int. Cl.
  *G01L 1/18* (2006.01)
  *G01L 1/20* (2006.01)

(56) References Cited

U.S. PATENT DOCUMENTS

| | | |
|---|---|---|
| 4,814,856 A | 3/1989 | Kurtz et al. |
| 4,914,624 A | 4/1990 | Dunthorn |
| 4,918,262 A | 4/1990 | Flowers et al. |
| 4,933,660 A | 6/1990 | Wynne |
| 4,983,786 A | 1/1991 | Stevens |
| 5,159,159 A | 10/1992 | Asher |
| 5,237,879 A | 8/1993 | Speeter |
| 5,320,705 A | 6/1994 | Fujii et al. |
| 5,333,505 A | 8/1994 | Takahashi et al. |
| 5,343,220 A | 8/1994 | Veasy et al. |
| 5,349,746 A | 9/1994 | Gruenwald et al. |
| 5,351,550 A | 10/1994 | Maurer |
| 5,483,994 A | 1/1996 | Maurer |
| 5,510,812 A | 4/1996 | O'mara et al. |
| 5,541,372 A | 7/1996 | Bailer et al. |
| 5,543,591 A | 8/1996 | Gillespie et al. |
| 5,565,657 A | 10/1996 | Merz |
| 5,600,074 A | 2/1997 | Marek et al. |
| 5,673,066 A | 9/1997 | Toda et al. |
| 5,773,728 A * | 6/1998 | Tsukada .............. G01L 1/18 338/5 |
| 5,889,236 A | 3/1999 | Gillespie et al. |
| 5,921,896 A | 7/1999 | Boland |
| 6,028,271 A | 2/2000 | Gillespie et al. |
| 6,159,166 A | 12/2000 | Chesney et al. |
| 6,243,075 B1 | 6/2001 | Fishkin et al. |
| 6,348,663 B1 | 2/2002 | Schoos et al. |
| 6,351,205 B1 | 2/2002 | Armstrong |
| 6,360,598 B1 | 3/2002 | Calame et al. |
| 6,437,682 B1 | 8/2002 | Vance |
| 6,555,235 B1 | 4/2003 | Aufderheide et al. |
| 6,556,189 B1 | 4/2003 | Takahata et al. |
| 6,569,108 B2 | 5/2003 | Sarvazyan et al. |
| 6,610,936 B2 | 8/2003 | Gillespie et al. |
| 6,620,115 B2 | 9/2003 | Sarvazyan et al. |
| 6,629,343 B1 | 10/2003 | Chesney et al. |
| 6,668,230 B2 | 12/2003 | Mansky et al. |
| 6,720,712 B2 | 4/2004 | Scott et al. |
| 6,788,297 B2 | 9/2004 | Itoh et al. |
| 6,801,191 B2 | 10/2004 | Mukai et al. |
| 6,809,280 B2 | 10/2004 | Divigalpitiya et al. |
| 6,812,621 B2 | 11/2004 | Scott |
| 6,822,640 B2 | 11/2004 | Derocher |
| 6,879,318 B1 | 4/2005 | Chan et al. |
| 6,888,537 B2 | 5/2005 | Benson et al. |
| 6,915,702 B2 * | 7/2005 | Omura .............. G01L 1/2293 73/777 |
| 6,931,938 B2 | 8/2005 | Knirck et al. |
| 6,995,752 B2 | 2/2006 | Lu |
| 7,138,984 B1 | 11/2006 | Miles |
| 7,173,607 B2 | 2/2007 | Matsumoto et al. |
| 7,190,350 B2 | 3/2007 | Roberts |
| 7,215,329 B2 | 5/2007 | Yoshikawa et al. |
| 7,218,313 B2 | 5/2007 | Marcus et al. |
| 7,224,257 B2 | 5/2007 | Morikawa |
| 7,245,293 B2 | 7/2007 | Hoshino et al. |
| 7,273,979 B2 | 9/2007 | Christensen |
| 7,280,097 B2 | 10/2007 | Chen et al. |
| 7,318,349 B2 * | 1/2008 | Vaganov .............. G01P 15/123 73/514.33 |
| 7,324,094 B2 | 1/2008 | Moilanen et al. |
| 7,324,095 B2 | 1/2008 | Sharma |
| 7,336,260 B2 | 2/2008 | Martin et al. |
| 7,337,085 B2 | 2/2008 | Soss |
| 7,345,680 B2 | 3/2008 | David |
| 7,406,661 B2 | 7/2008 | Vaananen et al. |
| 7,425,749 B2 | 9/2008 | Hartzell et al. |
| 7,426,873 B1 | 9/2008 | Kholwadwala et al. |
| 7,449,758 B2 | 11/2008 | Axelrod et al. |
| 7,460,109 B2 | 12/2008 | Safai et al. |
| 7,476,952 B2 | 1/2009 | Vaganov et al. |
| 7,508,040 B2 | 3/2009 | Nikkei et al. |
| 7,554,167 B2 | 6/2009 | Vaganov |
| 7,607,111 B2 | 10/2009 | Vaananen et al. |
| 7,620,521 B2 | 11/2009 | Breed et al. |
| 7,629,969 B2 | 12/2009 | Kent |
| 7,649,522 B2 | 1/2010 | Chen et al. |
| 7,663,612 B2 | 2/2010 | Bladt |
| 7,685,538 B2 | 3/2010 | Fleck et al. |
| 7,698,084 B2 | 4/2010 | Soss |
| 7,701,445 B2 | 4/2010 | Inokawa et al. |
| 7,746,327 B2 | 6/2010 | Miyakoshi |
| 7,791,151 B2 | 9/2010 | Vaganov et al. |
| 7,819,998 B2 | 10/2010 | David |
| 7,825,911 B2 | 11/2010 | Sano et al. |
| 7,903,090 B2 | 3/2011 | Soss et al. |
| 7,921,725 B2 | 4/2011 | Silverbrook et al. |
| 7,952,566 B2 | 5/2011 | Poupyrev et al. |
| 7,973,772 B2 | 7/2011 | Gettemy et al. |
| 7,973,778 B2 | 7/2011 | Chen |
| 8,004,052 B2 | 8/2011 | Vaganov |
| 8,004,501 B2 | 8/2011 | Harrison |
| 8,013,843 B2 | 9/2011 | Pryor |
| 8,026,906 B2 | 9/2011 | Moine et al. |
| 8,044,929 B2 | 10/2011 | Baldo et al. |
| 8,068,100 B2 | 11/2011 | Pryor |
| 8,072,437 B2 | 12/2011 | Miller et al. |
| 8,072,440 B2 | 12/2011 | Pryor |
| 8,113,065 B2 | 2/2012 | Ohsato et al. |
| 8,120,586 B2 | 2/2012 | Hsu et al. |
| 8,120,588 B2 | 2/2012 | Klinghult |
| 8,130,207 B2 | 3/2012 | Nurmi et al. |
| 8,134,535 B2 | 3/2012 | Choi et al. |
| 8,139,038 B2 | 3/2012 | Chueh et al. |
| 8,144,133 B2 | 3/2012 | Wang et al. |
| 8,149,211 B2 | 4/2012 | Hayakawa et al. |
| 8,154,528 B2 | 4/2012 | Chen et al. |
| 8,159,473 B2 | 4/2012 | Cheng et al. |
| 8,164,573 B2 | 4/2012 | Dacosta et al. |
| 8,183,077 B2 | 5/2012 | Vaganov et al. |
| 8,184,093 B2 | 5/2012 | Tsuiki |
| 8,188,985 B2 | 5/2012 | Hillis et al. |
| 8,199,116 B2 | 6/2012 | Jeon et al. |
| 8,212,790 B2 | 7/2012 | Rimas-Ribikauskas et al. |
| 8,237,537 B2 | 8/2012 | Kurtz et al. |
| 8,243,035 B2 | 8/2012 | Abe et al. |
| 8,253,699 B2 | 8/2012 | Son |
| 8,260,337 B2 | 9/2012 | Periyalwar et al. |
| 8,269,731 B2 | 9/2012 | Moine |
| 8,289,288 B2 | 10/2012 | Whytock et al. |
| 8,289,290 B2 | 10/2012 | Klinghult |
| 8,319,739 B2 | 11/2012 | Chu et al. |
| 8,325,143 B2 | 12/2012 | Destura et al. |
| 8,350,345 B2 | 1/2013 | Vaganov |
| 8,363,020 B2 | 1/2013 | Li et al. |
| 8,363,022 B2 | 1/2013 | Tho et al. |
| 8,378,798 B2 | 2/2013 | Bells et al. |
| 8,378,991 B2 | 2/2013 | Jeon et al. |
| 8,384,677 B2 | 2/2013 | Mak-Fan et al. |
| 8,387,464 B2 | 3/2013 | McNeil et al. |
| 8,405,631 B2 | 3/2013 | Chu et al. |
| 8,405,632 B2 | 3/2013 | Chu et al. |
| 8,421,609 B2 | 4/2013 | Kim et al. |
| 8,427,441 B2 | 4/2013 | Paleczny et al. |
| 8,436,806 B2 | 5/2013 | Almalki et al. |
| 8,436,827 B1 | 5/2013 | Zhai et al. |
| 8,451,245 B2 | 5/2013 | Heubel et al. |
| 8,456,440 B2 | 6/2013 | Abe et al. |
| 8,466,889 B2 | 6/2013 | Tong et al. |
| 8,477,115 B2 | 7/2013 | Rekimoto |
| 8,482,372 B2 * | 7/2013 | Kurtz .............. C03C 27/044 338/13 |
| 8,493,189 B2 | 7/2013 | Suzuki |

(56) References Cited

U.S. PATENT DOCUMENTS

| | | | |
|---|---|---|---|
| 8,497,757 B2* | 7/2013 | Kurtz | C03C 27/044 338/13 |
| 8,516,906 B2* | 8/2013 | Umetsu | G01L 1/18 29/25.01 |
| 9,487,388 B2* | 11/2016 | Brosh | B81B 3/0021 |
| 9,493,342 B2* | 11/2016 | Brosh | B81B 3/0021 |
| 2003/0067448 A1 | 4/2003 | Park | |
| 2003/0189552 A1 | 10/2003 | Chuang et al. | |
| 2004/0012572 A1 | 1/2004 | Sowden et al. | |
| 2004/0140966 A1 | 7/2004 | Marggraff et al. | |
| 2006/0028441 A1 | 2/2006 | Armstrong | |
| 2006/0244733 A1 | 11/2006 | Geaghan | |
| 2006/0284856 A1 | 12/2006 | Soss | |
| 2007/0035525 A1 | 2/2007 | Yeh et al. | |
| 2007/0046649 A1 | 3/2007 | Reiner | |
| 2007/0070046 A1 | 3/2007 | Sheynblat et al. | |
| 2007/0070053 A1 | 3/2007 | Lapstun et al. | |
| 2007/0097095 A1 | 5/2007 | Kim et al. | |
| 2007/0103449 A1 | 5/2007 | Laitinen et al. | |
| 2007/0103452 A1 | 5/2007 | Wakai et al. | |
| 2007/0115265 A1 | 5/2007 | Rainisto | |
| 2007/0132717 A1 | 6/2007 | Wang et al. | |
| 2007/0137901 A1 | 6/2007 | Chen | |
| 2007/0139391 A1 | 6/2007 | Bischoff | |
| 2007/0152959 A1 | 7/2007 | Peters | |
| 2007/0156723 A1 | 7/2007 | Vaananen | |
| 2007/0182864 A1 | 8/2007 | Stoneham et al. | |
| 2007/0229478 A1 | 10/2007 | Rosenberg et al. | |
| 2007/0235231 A1 | 10/2007 | Loomis et al. | |
| 2007/0245836 A1 | 10/2007 | Vaganov | |
| 2007/0262965 A1 | 11/2007 | Hirai et al. | |
| 2007/0277616 A1 | 12/2007 | Nikkel et al. | |
| 2007/0298883 A1 | 12/2007 | Feldman et al. | |
| 2008/0001923 A1 | 1/2008 | Hall et al. | |
| 2008/0007532 A1 | 1/2008 | Chen | |
| 2008/0010616 A1 | 1/2008 | Algreatly | |
| 2008/0024454 A1 | 1/2008 | Everest | |
| 2008/0030482 A1 | 2/2008 | Elwell et al. | |
| 2008/0036743 A1 | 2/2008 | Westerman et al. | |
| 2008/0088600 A1 | 4/2008 | Prest et al. | |
| 2008/0094367 A1 | 4/2008 | Van De Ven et al. | |
| 2008/0105470 A1 | 5/2008 | Van De Ven et al. | |
| 2008/0106523 A1 | 5/2008 | Conrad | |
| 2008/0174852 A1 | 7/2008 | Hirai et al. | |
| 2008/0180402 A1 | 7/2008 | Yoo et al. | |
| 2008/0180405 A1 | 7/2008 | Han et al. | |
| 2008/0180406 A1 | 7/2008 | Han et al. | |
| 2008/0202249 A1 | 8/2008 | Yokura et al. | |
| 2008/0204427 A1 | 8/2008 | Heesemans et al. | |
| 2008/0211766 A1 | 9/2008 | Westerman et al. | |
| 2008/0238446 A1 | 10/2008 | Denatale et al. | |
| 2008/0238884 A1 | 10/2008 | Harish | |
| 2008/0259046 A1 | 10/2008 | Carsanaro | |
| 2008/0284742 A1 | 11/2008 | Prest et al. | |
| 2008/0303799 A1 | 12/2008 | Schwesig et al. | |
| 2009/0027352 A1 | 1/2009 | Abele | |
| 2009/0027353 A1 | 1/2009 | Im et al. | |
| 2009/0046110 A1 | 2/2009 | Sadler et al. | |
| 2009/0102805 A1 | 4/2009 | Meijer et al. | |
| 2009/0140985 A1 | 6/2009 | Liu | |
| 2009/0184921 A1 | 7/2009 | Scott et al. | |
| 2009/0184936 A1 | 7/2009 | Algreatly | |
| 2009/0213066 A1 | 8/2009 | Hardacker et al. | |
| 2009/0237374 A1 | 9/2009 | Li et al. | |
| 2009/0242282 A1 | 10/2009 | Kim et al. | |
| 2009/0243817 A1 | 10/2009 | Son | |
| 2009/0243998 A1 | 10/2009 | Wang | |
| 2009/0256807 A1 | 10/2009 | Nurmi | |
| 2009/0256817 A1 | 10/2009 | Perlin et al. | |
| 2009/0282930 A1 | 11/2009 | Cheng et al. | |
| 2009/0303400 A1 | 12/2009 | Hou et al. | |
| 2009/0309852 A1 | 12/2009 | Lin et al. | |
| 2009/0314551 A1 | 12/2009 | Nakajima | |
| 2010/0013785 A1 | 1/2010 | Murai et al. | |
| 2010/0020030 A1 | 1/2010 | Kim et al. | |
| 2010/0020039 A1 | 1/2010 | Ricks et al. | |
| 2010/0039396 A1 | 2/2010 | Ho et al. | |
| 2010/0053087 A1 | 3/2010 | Dai et al. | |
| 2010/0053116 A1 | 3/2010 | Daverman et al. | |
| 2010/0066686 A1 | 3/2010 | Joguet et al. | |
| 2010/0066697 A1 | 3/2010 | Jacomet et al. | |
| 2010/0079391 A1 | 4/2010 | Joung | |
| 2010/0079395 A1 | 4/2010 | Kim et al. | |
| 2010/0079398 A1 | 4/2010 | Shen et al. | |
| 2010/0097347 A1 | 4/2010 | Lin | |
| 2010/0117978 A1 | 5/2010 | Shirado | |
| 2010/0123671 A1 | 5/2010 | Lee | |
| 2010/0123686 A1 | 5/2010 | Klinghult et al. | |
| 2010/0127140 A1 | 5/2010 | Smith | |
| 2010/0128002 A1 | 5/2010 | Stacy et al. | |
| 2010/0153891 A1 | 6/2010 | Vaananen et al. | |
| 2010/0164959 A1 | 7/2010 | Brown et al. | |
| 2010/0220065 A1 | 9/2010 | Ma | |
| 2010/0271325 A1 | 10/2010 | Conte et al. | |
| 2010/0289807 A1 | 11/2010 | Yu et al. | |
| 2010/0295807 A1 | 11/2010 | Xie et al. | |
| 2010/0308844 A1 | 12/2010 | Day et al. | |
| 2010/0309714 A1 | 12/2010 | Meade | |
| 2010/0315373 A1 | 12/2010 | Steinhauser et al. | |
| 2010/0321310 A1 | 12/2010 | Kim et al. | |
| 2010/0321319 A1 | 12/2010 | Hefti et al. | |
| 2010/0323467 A1 | 12/2010 | Vaganov et al. | |
| 2010/0328229 A1 | 12/2010 | Weber et al. | |
| 2010/0328230 A1 | 12/2010 | Faubert et al. | |
| 2011/0001723 A1 | 1/2011 | Fan | |
| 2011/0006980 A1 | 1/2011 | Taniguchi et al. | |
| 2011/0007008 A1 | 1/2011 | Algreatly | |
| 2011/0012848 A1 | 1/2011 | Li et al. | |
| 2011/0018820 A1 | 1/2011 | Huitema et al. | |
| 2011/0032211 A1 | 2/2011 | Christoffersen | |
| 2011/0039602 A1 | 2/2011 | McNamara et al. | |
| 2011/0050628 A1 | 3/2011 | Homma et al. | |
| 2011/0050630 A1 | 3/2011 | Ikeda | |
| 2011/0057899 A1 | 3/2011 | Sleeman et al. | |
| 2011/0063248 A1 | 3/2011 | Yoon | |
| 2011/0113881 A1* | 5/2011 | Suzuki | G01P 15/0802 73/514.36 |
| 2011/0128250 A1 | 6/2011 | Murphy et al. | |
| 2011/0141052 A1 | 6/2011 | Bernstein et al. | |
| 2011/0141053 A1 | 6/2011 | Bulea et al. | |
| 2011/0187674 A1 | 8/2011 | Baker et al. | |
| 2011/0209555 A1 | 9/2011 | Ahles et al. | |
| 2011/0227836 A1 | 9/2011 | Li et al. | |
| 2011/0242014 A1 | 10/2011 | Tsai et al. | |
| 2011/0267181 A1 | 11/2011 | Kildal | |
| 2011/0267294 A1 | 11/2011 | Kildal | |
| 2011/0273396 A1 | 11/2011 | Chung | |
| 2011/0291951 A1 | 12/2011 | Tong | |
| 2011/0298705 A1 | 12/2011 | Vaganov | |
| 2012/0032907 A1 | 2/2012 | Koizumi et al. | |
| 2012/0032915 A1 | 2/2012 | Wittorf | |
| 2012/0038579 A1 | 2/2012 | Sasaki | |
| 2012/0044169 A1 | 2/2012 | Enami | |
| 2012/0044172 A1 | 2/2012 | Ohki et al. | |
| 2012/0050159 A1 | 3/2012 | Yu et al. | |
| 2012/0050208 A1 | 3/2012 | Dietz | |
| 2012/0056837 A1 | 3/2012 | Park et al. | |
| 2012/0062603 A1 | 3/2012 | Mizunuma et al. | |
| 2012/0068946 A1 | 3/2012 | Tang et al. | |
| 2012/0068969 A1 | 3/2012 | Bogana et al. | |
| 2012/0081327 A1 | 4/2012 | Heubel et al. | |
| 2012/0086659 A1 | 4/2012 | Perlin et al. | |
| 2012/0092250 A1 | 4/2012 | Hadas et al. | |
| 2012/0092279 A1 | 4/2012 | Martin | |
| 2012/0092294 A1 | 4/2012 | Ganapathi et al. | |
| 2012/0092299 A1 | 4/2012 | Harada et al. | |
| 2012/0092324 A1 | 4/2012 | Buchan et al. | |
| 2012/0105358 A1 | 5/2012 | Momeyer et al. | |
| 2012/0105367 A1 | 5/2012 | Son et al. | |
| 2012/0113061 A1 | 5/2012 | Ikeda | |
| 2012/0127088 A1 | 5/2012 | Pance et al. | |
| 2012/0127107 A1 | 5/2012 | Miyashita et al. | |
| 2012/0139864 A1 | 6/2012 | Sleeman et al. | |
| 2012/0144921 A1 | 6/2012 | Bradley et al. | |

(56) References Cited

U.S. PATENT DOCUMENTS

| | | |
|---|---|---|
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Aono |
| 2012/0154316 A1 | 6/2012 | Kono |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Maenpaa |
| 2012/0169635 A1 | 7/2012 | Liu |
| 2012/0169636 A1 | 7/2012 | Liu |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0218212 A1 | 8/2012 | Yu et al. |
| 2012/0286379 A1 | 11/2012 | Inoue |
| 2012/0319987 A1 | 12/2012 | Woo |
| 2012/0327025 A1 | 12/2012 | Huska et al. |
| 2013/0038541 A1 | 2/2013 | Bakker |
| 2013/0093685 A1 | 4/2013 | Kalu et al. |
| 2013/0140944 A1* | 6/2013 | Chen .................. H03H 3/007 310/300 |
| 2013/0341741 A1 | 12/2013 | Brosh et al. |
| 2013/0341742 A1 | 12/2013 | Brosh et al. |
| 2014/0007705 A1 | 1/2014 | Campbell et al. |
| 2014/0028575 A1 | 1/2014 | Parivar et al. |
| 2014/0055407 A1 | 2/2014 | Lee et al. |
| 2014/0367811 A1* | 12/2014 | Nakagawa ........... H04R 19/005 257/416 |
| 2016/0363490 A1 | 12/2016 | Campbell et al. |

FOREIGN PATENT DOCUMENTS

| | | |
|---|---|---|
| WO | 2004/113859 | 12/2004 |
| WO | 2004113859 A1 | 12/2004 |
| WO | 2007/139695 | 12/2007 |

OTHER PUBLICATIONS

Nesterov, V., et al., "Modelling and investigation of the silicon twin design 3D micro probe," Journal of Micromechanics and Microengineering, vol. 15, 2005, pp. 514-520.

International Preliminary Report on Patentability and Written Opinion, dated Jul. 19, 2016, received in connection with International Patent Application No. PCT/US2015/011144.

Co-pending U.S. Appl. No. 13/923,998, filed Jun. 21, 2013, Inventor Amnon Brosh.

Co-pending U.S. Appl. No. 13/924,047, filed Jun. 21, 2013, Inventor Amnon Brosh.

Co-pending U.S. Appl. No. 15/178,976, filed Jun. 10, 2016, Inventors Campbell et al.

International Search Report and Written Opinion issued in related International Application No. PCT/US15/011144 dated Apr. 28, 2015.

Extended European Search Report, dated Aug. 14, 2017, received in connection with European Application No. 15735327.

* cited by examiner

MINIATURIZED AND RUGGEDIZED WAFER LEVEL MEMS FORCE SENSORS

CROSS-REFERENCE TO RELATED APPLICATIONS

This application is a 371 of International Application No. PCT/US2015/011144,filed Jan. 13, 2015, which claims the benefit of U.S. Provisional Application No. 61/926,472,filed Jan. 13, 2014, U.S. Provisional Application No. 61/937,509, filed Feb. 8, 2014, U.S. Provisional Application No. 61/983,553, filed Apr. 24, 2014, and U.S. Provisional Application No. 62/004,264, filed May 29, 2014.

STATEMENT REGARDING FEDERALLY FUNDED RESEARCH

This invention was made with government support under SBIR Award No. 1353450 awarded by the U.S. National Science Foundation. The government has certain rights in the invention.

FIELD OF TECHNOLOGY

The present invention relates to MEMS force sensing dies used for converting force into strain, which is sensed by piezoresistive strain gauges.

BACKGROUND

Current technology MEMS force dies are based on linking the applied force to the center of a sensing diaphragm comprising four piezoresistive strain gauges. The contact pads are positioned around the diaphragm, which makes current force dies relatively large. In addition, current MEMS force dies are fragile, lack the robustness of other force sensing technologies, such as force sensitive resistors, and are susceptible to debris from the external environment.

Accordingly, there is a need in the pertinent art for a small, low-cost, silicon force sensor that may be sealed and that is robust against mechanical overload.

SUMMARY

The present invention pertains to a microelectromechanical ("MEMS") force sensor comprising multiple compact sensing elements positioned on the periphery of the die. Each sensing element is comprised of a flexure and a piezoresistive strain gauge. In one exemplary embodiment, four sensing elements may be employed in each force die, although additional or fewer sensing elements may also be used. The small sensing element reduces die size and the peripheral layout allows retaining walls to be included, which prevents dicing debris from entering the die and clogging the overload stop. In addition, in one embodiment, the peripheral layout allows the die to be fully sealed against debris from the external environment.

The dies may be manufactured by bonding a cap (typically Pyrex) wafer to a base (typically silicon) wafer. The sensing elements may be formed by etching flexures on the top side of the silicon wafer. Some flexures may also require etching grooves or slots on the bottom side. Piezoresistive strain gauges may also be diffused on the flexures and interconnected to the contact pads on the bottom of the die.

The bond between the base and cap wafers includes a gap produced by protrusions sculptured either on the top of the base and/or on the bottom of the cap. In exemplary embodiments, after the Pyrex wafer is bonded, release slots are etched on the periphery of base. In some embodiments, the slots release a retaining wall, designed to prevent debris from entering the air gap, from the rest of the base. The protrusions and retaining wall deflect with force, straining the piezoresistive strain gauges and producing an output signal proportional to the force. The gap may be designed to limit the displacement of the cap in order to provide force overload protection.

BRIEF DESCRIPTION OF THE FIGURES

These and other features of the preferred embodiments of the invention will become more apparent in the detailed description in which reference is made to the appended drawings wherein.

DETAILED DESCRIPTION

The present invention can be understood more readily by reference to the following detailed description, examples, drawings, and their previous and following description. However, before the present devices, systems, and/or methods are disclosed and described, it is to be understood that this invention is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description of the invention is provided as an enabling teaching of the invention in its best, currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

As used throughout, the singular forms "a," "an" and "the" include plural referents unless the context clearly dictates otherwise. Thus, for example, reference to "a force sensor" can include two or more such force sensors unless the context indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Figure 1:
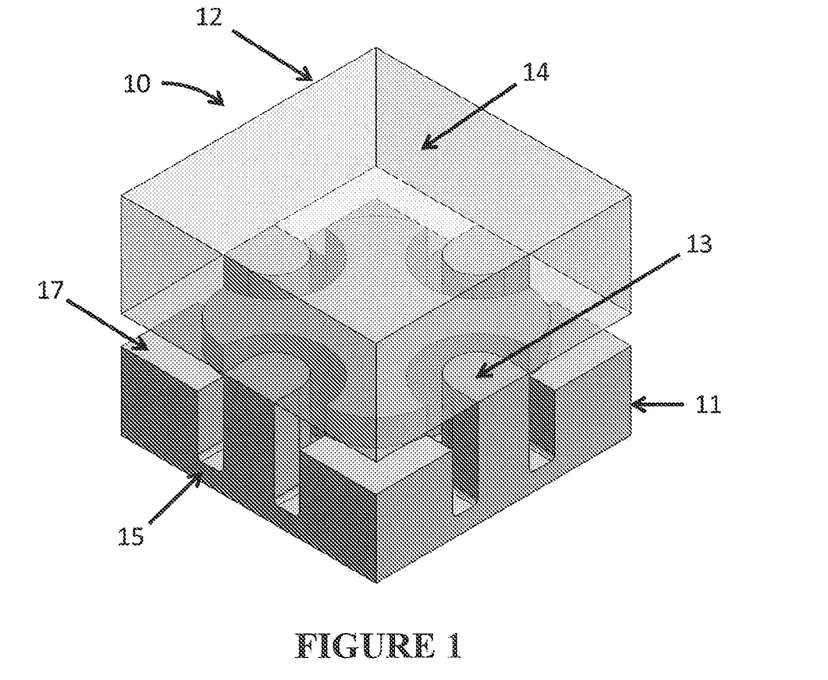
FIG. 1 is an isometric view of the MEMS force sensor.
Figure 2:
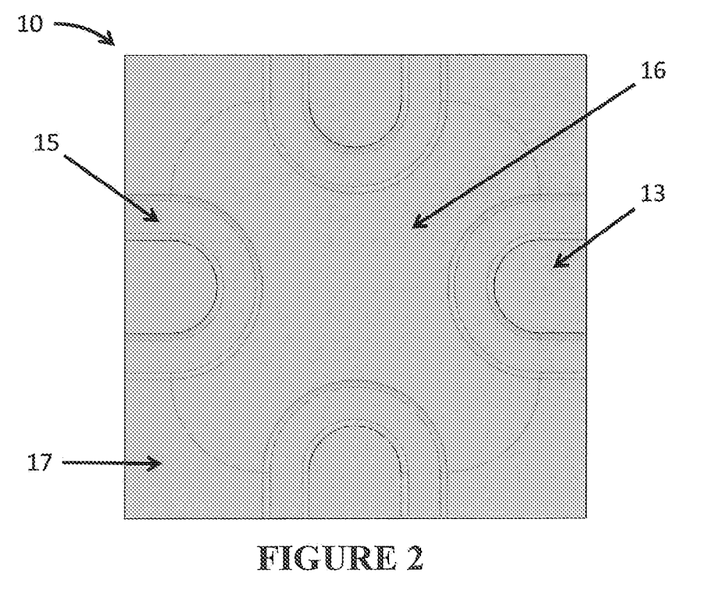
FIG. 2 is a top view of the MEMS force sensor.
Figure 3:
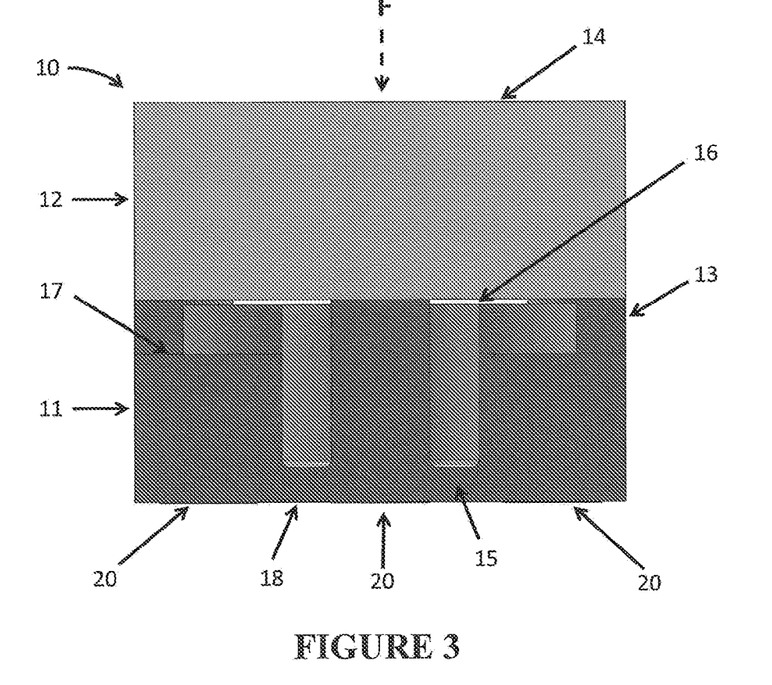
FIG. 3 is a side view of the MEMS force sensor.

The present invention relates to a microelectromechanical system ("MEMS") force sensor device 10 for measuring a force applied to at least a portion thereof. In one aspect, as depicted in FIGS. 1-3, the force sensor device comprises a base 11 and a cap 12 adhered at the surfaces formed by at least one rigid boss 13 in the base 11. A contact surface 14 exists along the top surface of the cap 12 for receiving an applied force F and transmitting the force F through the at least one rigid boss 13 to at least one flexure 15. The base 11 comprises an air gap 16 between the base 11 and cap 12 wherein the thickness of the air gap 16 is determined by the breaking deflection of the at least one flexure 15, such that the air gap 16 between the base 11 and the cap 12 will close and stop further deflection before the at least one flexible membrane 15 is broken.

It is contemplated that the air gap 16 formed between the base 11 and cap 12 could collect debris during the process of dicing the device. To mitigate this effect, the base comprises a shelf 17 that is etched significantly below the air gap 16. The shelf 17 creates a distance between the dicing interface at the edge of the base 11 and the air gap 16 where debris will tend to collect, creating a channel for water to carry away debris and preventing mechanical interference with the functional range of the device.

Figure 4:
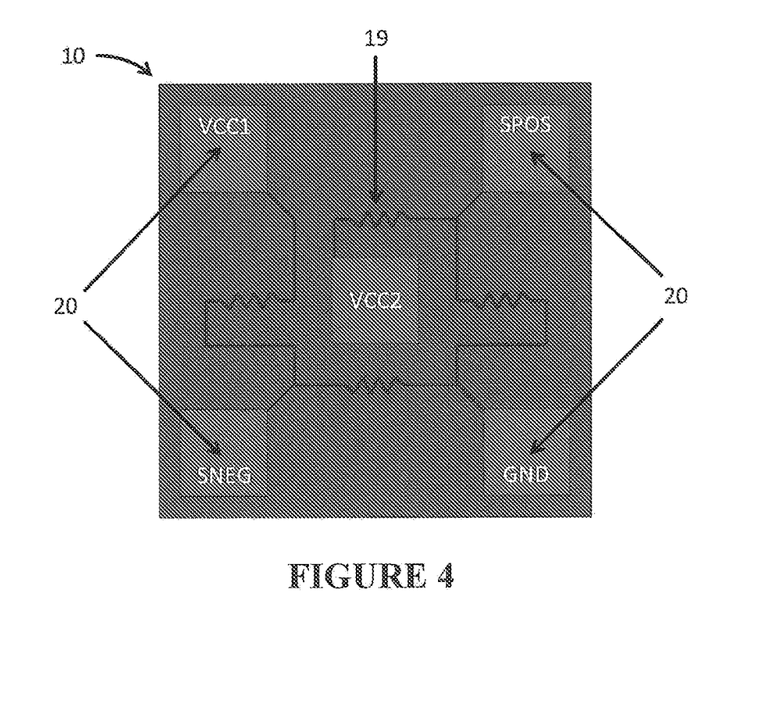
FIG. 4 is a bottom view of the MEMS force sensor.

Referring now to FIGS. 3 and 4, the side and bottom views of the device are shown, respectively. The force sensor device comprises at least one deposited or implanted piezoresistive element on the bottom surface 18 of the base 11. As strain is induced in the at least one flexure 15 proportional to the force F, a localized strain is produced on the piezoresistive elements 19 (depicted schematically), such that the piezoresistive elements 19 experience compression, depending on their specific orientation. As the piezoresistive elements compress and tense, their resistivity changes in opposite fashion, such that a Wheatstone bridge circuit containing four piezoresistive elements 19 (two of each orientation relative to strain) becomes unbalanced and produces a differential voltage across the positive signal terminal SPOS and the negative signal terminal SNEG. This differential voltage is directly proportional to the applied force F on the contact surface 14, and is measured through electrical terminals 20 that are connected to external circuitry.

Figure 5:
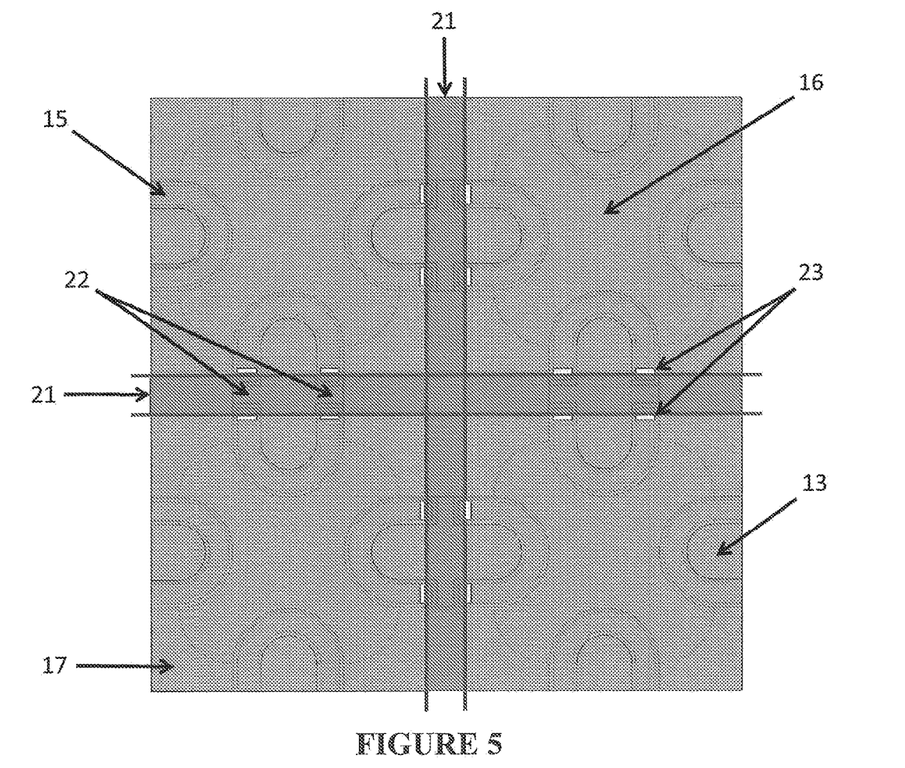
FIG. 5 is a top view of a wafer section comprising a 2×2 array of MEMS force sensors.

Referring now to FIG. 5, the top view of an undiced section of a wafer is shown. The wafer section comprises two dicing lanes 21 to separate a 2×2 array of devices. The at least one rigid boss are supported on two sides by bridges 22 which prevent the at least one flexure 15 from bending under the pressure of the bonding process that attaches the base 11 to the cap 12. Without the bridges 22, the at least one rigid boss 13 would only be supported by the at least one flexure 15. This would deform under pressure, causing the air gap 16 to close and resulting in the cap 12 bonding to the entire base 11, effectively eliminating the functional range of the device. The bridges 22 are placed in the dicing lanes 21 such that they will be removed during dicing to release the at least one rigid boss 13 and allow it to move with applied force F.

Referring still to FIG. 5, the wafer section comprises etched holes 23 at the edges of the at least one flexure 15. The holes 23 are etched into the base prior to dicing such that when the wafer is diced, the blade does not come into contact with the at least one flexure 15. This technique allows for smooth surface edges to be achieved by etching processes, which in turn increases the at least one flexure's 15 yield strength.

Figure 6:
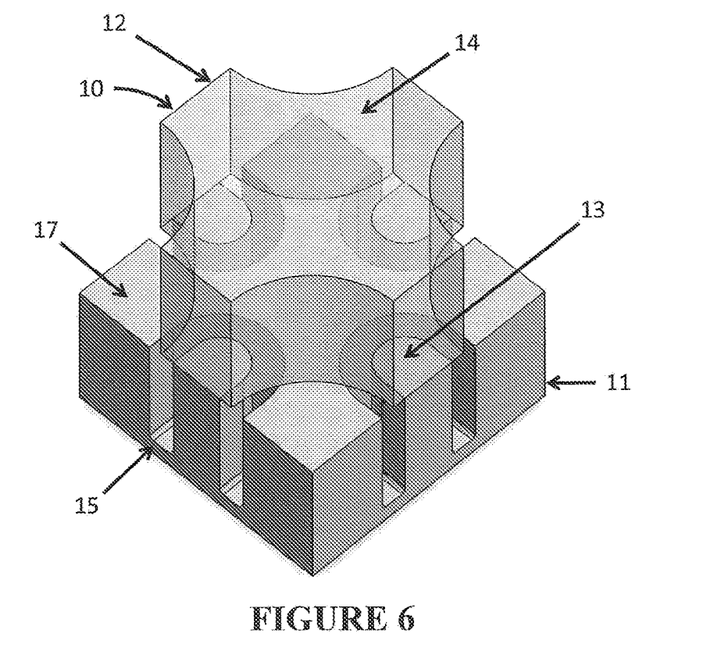
FIG. 6 is an isometric view of the MEMS force sensor with a machined cap.
Figure 7:
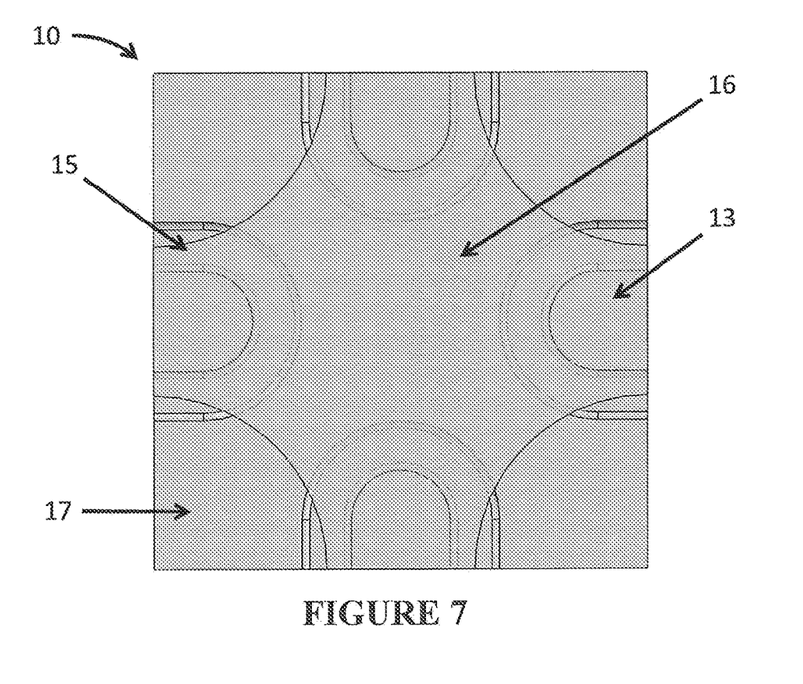
FIG. 7 is a top view of the MEMS force sensor with a machined cap.

Referring now to FIGS. 6 and 7, in another embodiment, the force sensor device comprises a base 11 and a cap 12 adhered at the surfaces formed by at least one rigid boss 13 in the base 11. A contact surface 14 exists along the top surface of the cap 12 for receiving an applied force F and transmitting the force F through the at least one rigid boss 13 to at least one flexure 15. The base 11 comprises an air gap 16 between the base 11 and cap 12 wherein the thickness of the air gap 16 is determined by the breaking deflection of the at least one flexure 15, such that the air gap 16 between the base 11 and the cap 12 will close and stop further deflection before the at least one flexible membrane 15 is broken.

It is contemplated that the air gap 16 formed between the base 11 and cap 12 could collect debris during the process of dicing the device. To mitigate this effect, the cap comprises quarter circle machined holes 24. The holes 24 create a distance between the dicing interface at the edge of the base 11 and the air gap 16 where debris will tend to collect, creating a channel for water to carry away debris and preventing mechanical interference with the functional range of the device.

Figure 8:
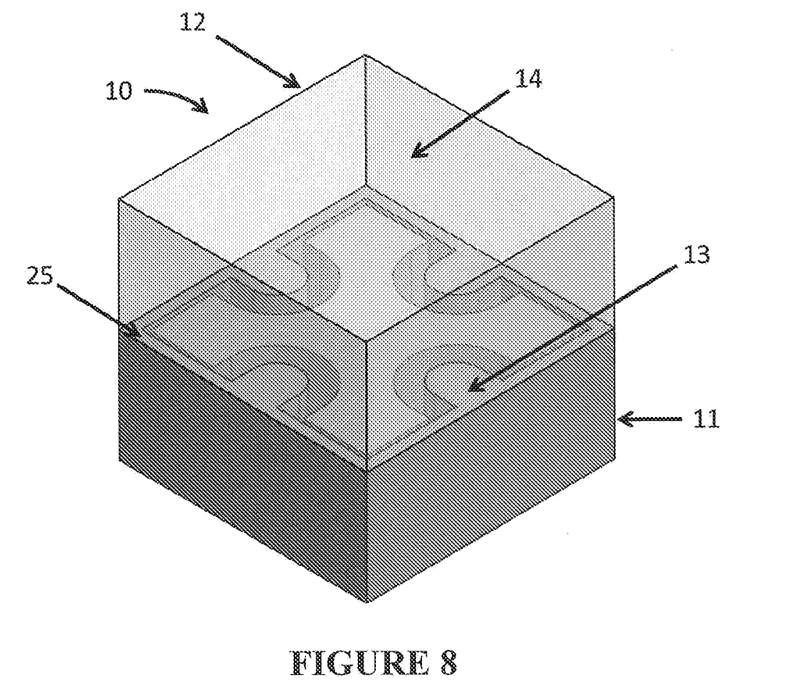
FIG. 8 is an isometric view of the MEMS force sensor with a retaining wall.
Figure 9:
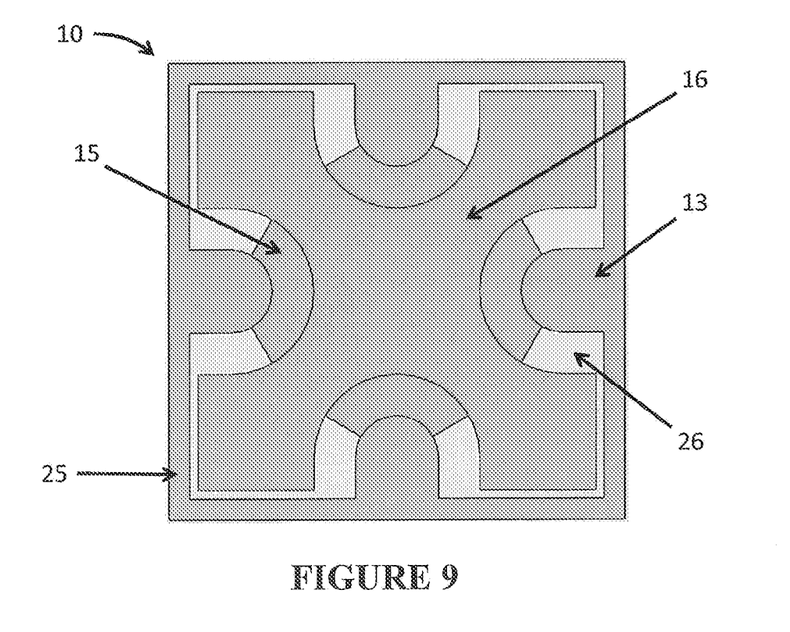
FIG. 9 is a top view of the MEMS force sensor with a retaining wall.

Referring now to FIGS. 8 and 9, in yet another embodiment, the force sensor device comprises a base 11 and a cap 12 adhered at the surfaces formed by at least one rigid boss 13 and retaining wall 25 in the base 11. A contact surface 14 exists along the top surface of the cap 12 for receiving an applied force F and transmitting the force F through the at least one rigid boss 13 and retaining wall 25 to at least one flexure 15. The base 11 comprises an air gap 16 between the base 11 and cap 12 wherein the thickness of the air gap 16 is determined by the breaking deflection of the at least one flexure 15, such that the air gap 16 between the base 11 and the cap 12 will close and stop further deflection before the at least one flexible membrane 15 is broken.

It is contemplated that the air gap 16 formed between the base 11 and cap 12 could collect debris during the process of dicing the device. To mitigate this effect, the base comprises a retaining wall 25. The retaining wall 25 is released and allowed to move with respect to the rest of the base 11 due to slots 26 etched through the base. The cap 12 and the base 11 are sealed together at the retaining wall 25 in order to prevent debris from entering the air gap 16 during dicing.

Figure 10:
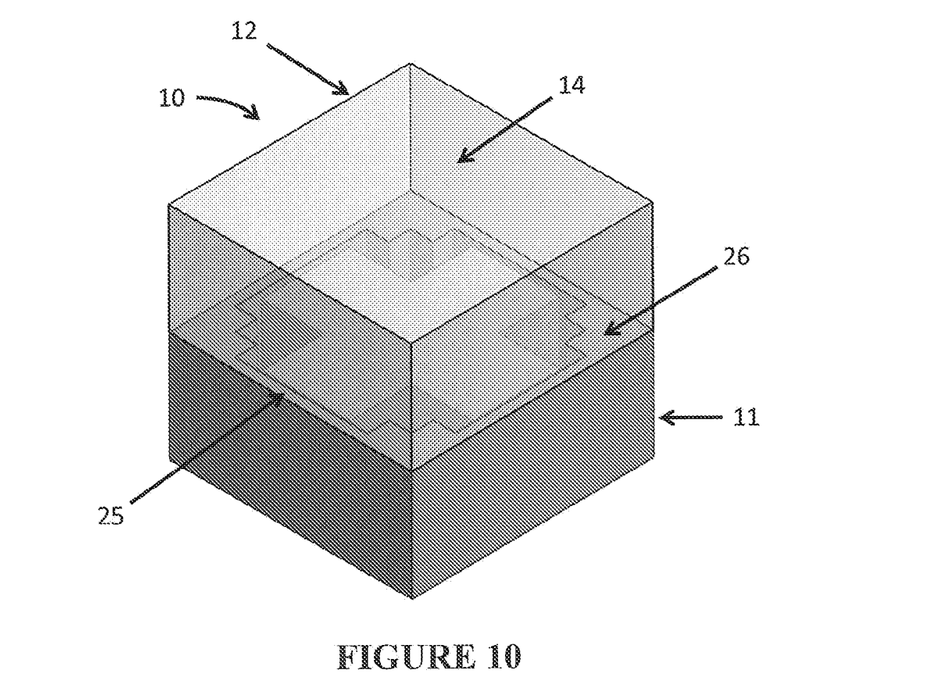
FIG. 10 is an isometric view of the MEMS force sensor with a retaining wall and corner flexures.
Figure 11:
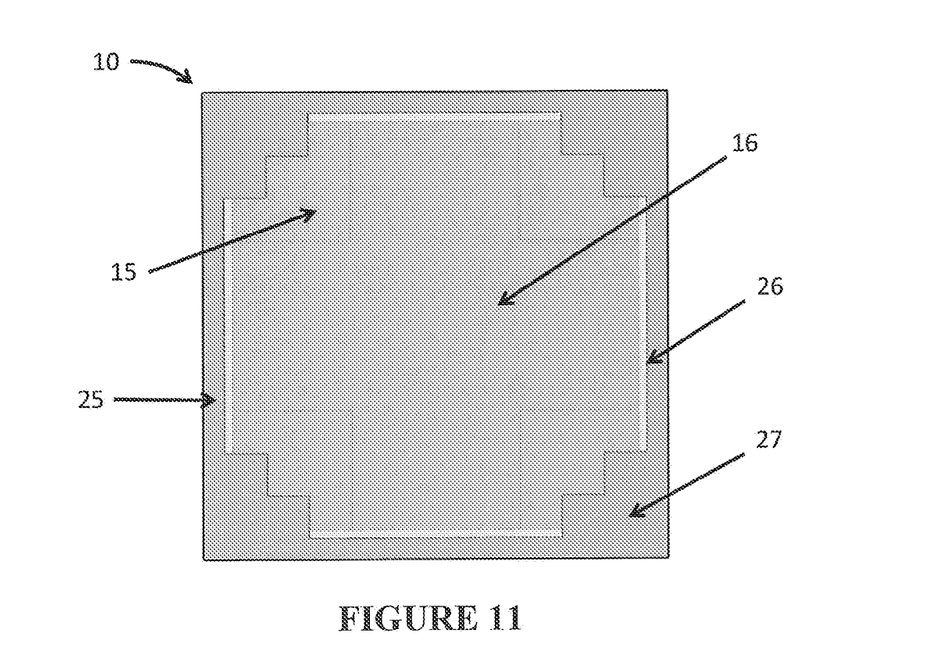
FIG. 11 is a top view of the MEMS force sensor with a retaining wall and corner flexures.

Referring now to FIGS. 10 and 11, in yet another embodiment, the force sensor device comprises a base 11 and a cap 12 adhered at the surfaces formed by at least one rigid corner 27 and retaining wall 25 in the base 11. A contact surface 14 exists along the top surface of the cap 12 for receiving an applied force F and transmitting the force F through the at least one rigid corner 27 and retaining wall 25 to at least one flexure 15. The base 11 comprises an air gap 16 between the base 11 and cap 12 wherein the thickness of the air gap 16 is determined by the breaking deflection of the at least one flexure 15, such that the air gap 16 between the base 11 and the cap 12 will close and stop further deflection before the at least one flexible membrane 15 is broken.

It is contemplated that the air gap 16 formed between the base 11 and cap 12 could collect debris during the process of dicing the device. To mitigate this effect, the base comprises a retaining wall 25. The retaining wall 25 is released and allowed to move with respect to the rest of the base 11 due to slots 26 etched through the base. The cap 12 and the base 11 are sealed together at the retaining wall 25 in order to prevent debris from entering the air gap 16 during dicing.

Figure 12:
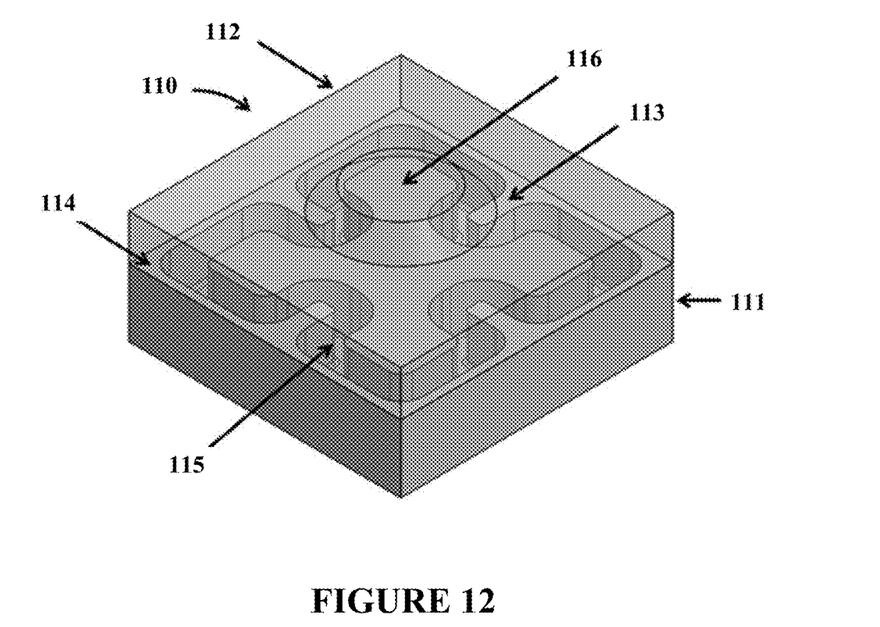
FIG. 12 is an isometric view of the MEMS force sensor according to another exemplary embodiment.
Figure 13:
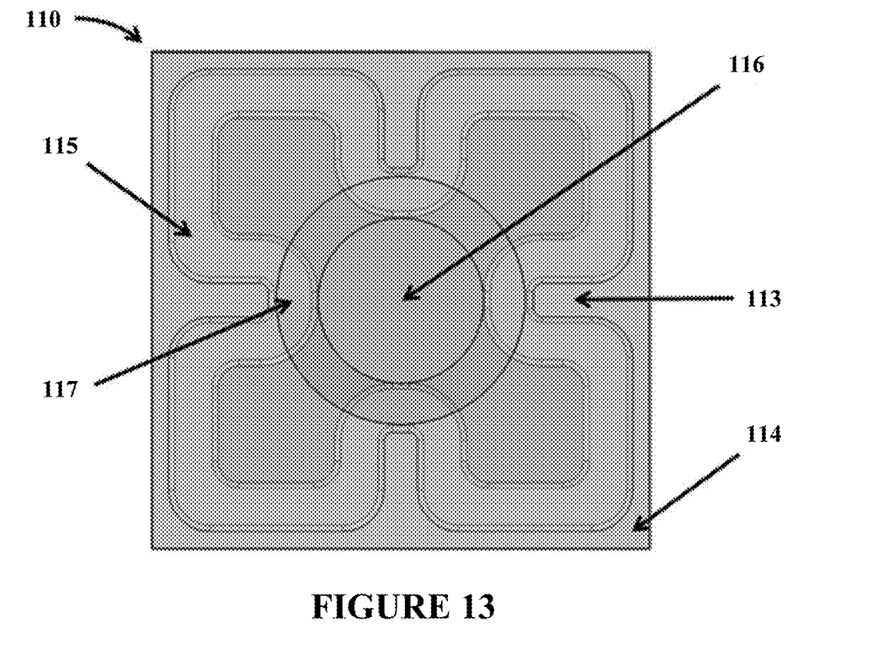
FIG. 13 is a top view of the MEMS force sensor according to another exemplary embodiment.
Figure 14:
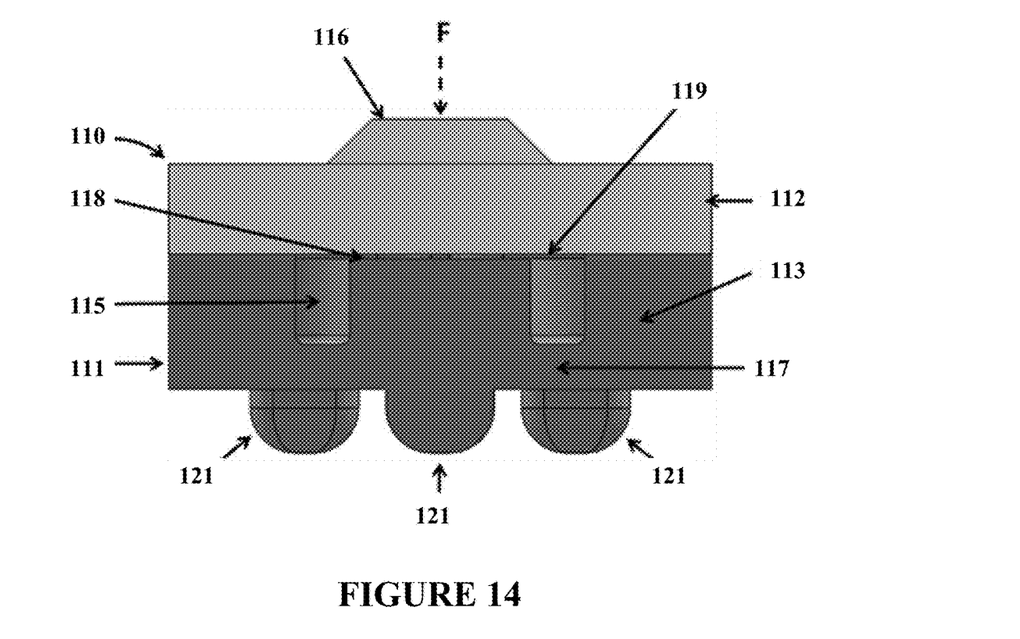
FIG. 14 is a side view of the MEMS force sensor according to another exemplary embodiment.

FIG. 12 illustrates an isometric view of the MEMS force sensor according to another exemplary embodiment. In particular, FIG. 12 illustrates a microelectromechanical system ("MEMS") force sensor device 110 for measuring a force applied to at least a portion thereof. In one aspect, as depicted in FIGS. 12-14, the force sensor device includes a base 111 and a cap 112 adhered at the surfaces formed by at least one rigid boss 113 and an outer wall 114 in the base 111. The surfaces adhered between the base 111 and the cap 112 form a sealed cavity 115. A contact surface 116 exists along the top surface of the cap 112 for receiving an applied force F and transmitting the force F through the at least one rigid boss 113 and outer wall 114 to at least one flexure 117. The sealed cavity 115 may include an air gap 118 between the base 111 and cap 112 wherein the thickness of the air gap 118 may be determined by the breaking deflection of the at least one flexure 117, such that the air gap 118 between the base 111 and the cap 112 will close and stop further deflection before the at least one flexure 117 is broken.

Figure 15:
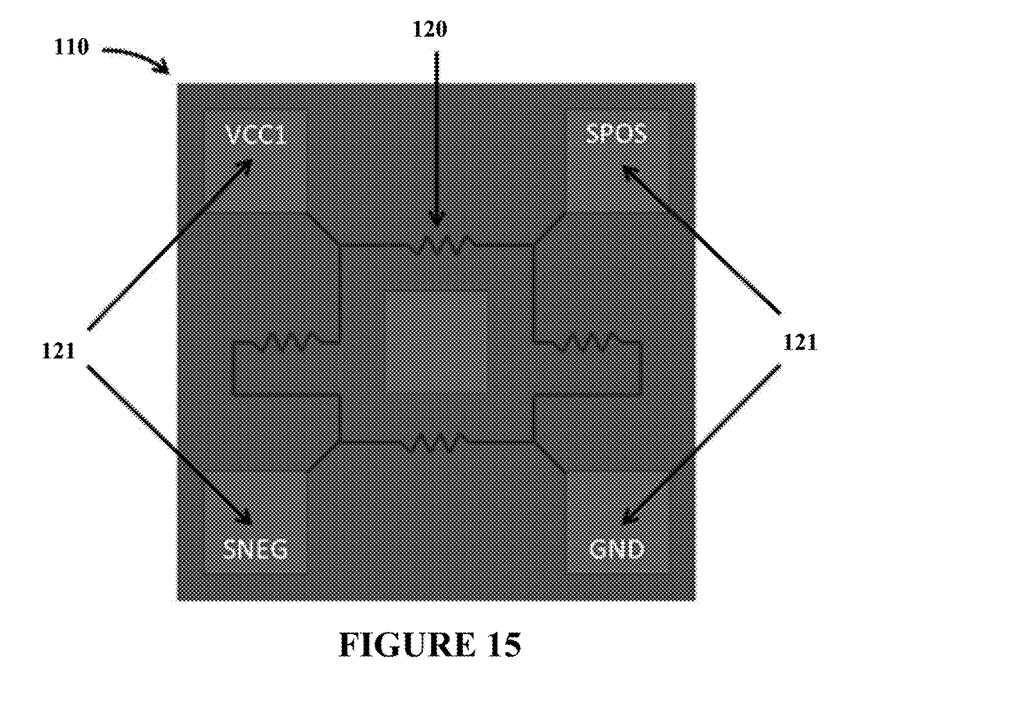
FIG. 15 is a bottom view of the MEMS force sensor according to another exemplary embodiment.

Referring now to FIGS. 14 and 15, the side and bottom views of the device are shown, respectively. The force sensor device includes at least one deposited or implanted piezoresistive element on the bottom surface 119 of the base 111. As strain is induced in the at least one flexure 117 proportional to the force F, a localized strain is produced on the piezoresistive elements 120 (depicted schematically), such that the piezoresistive elements 120 experience compression, depending on their specific orientation. As the piezoresistive elements compress and tense, their resistivity changes in opposite fashion, such that a Wheatstone bridge circuit containing four piezoresistive elements 120 (two of each orientation relative to strain) becomes unbalanced and produces a differential voltage across the positive signal terminal SPOS and the negative signal terminal SNEG. This differential voltage is directly proportional to the applied force F on the contact surface 116, and may be measured through electrical terminals 121 that are connected to external circuitry. The electrical terminals 121 may comprise solder bumps to allow flip-chip assembly.

Figure 16:
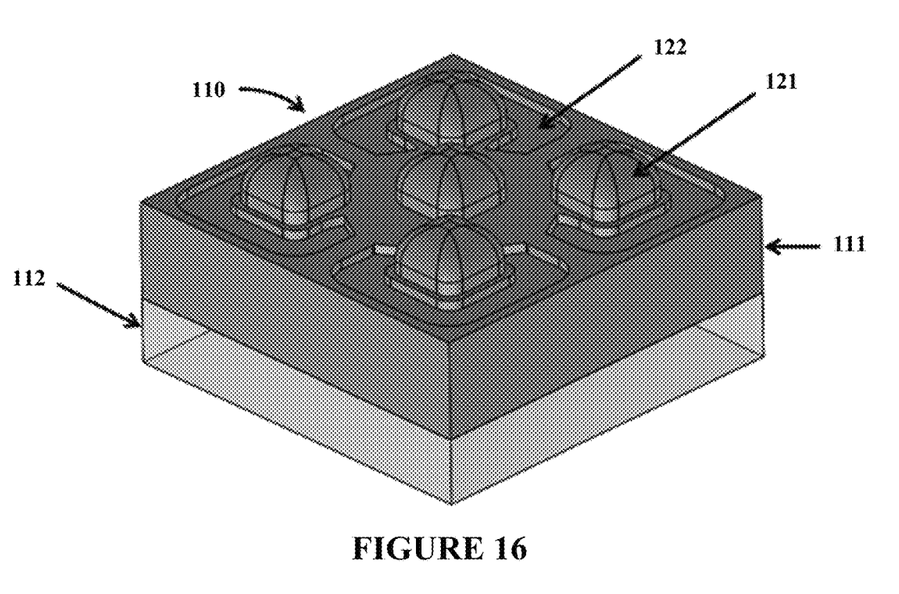
FIG. 16 is an isometric bottom view of the MEMS force sensor according to another exemplary embodiment.

Referring now to FIG. 16, an isometric view of the bottom of the device is shown. The force sensor device may include grooves 122 sculptured into the bottom surface of the base 111. The grooves 122 may serve to reduce the amount of force absorbed by the peripheral flexures around the outer electrical terminals 121 and increase the amount of force absorbed by one or more center flexures, thereby increasing the strain in the piezoresistive elements 120 and improving overall sensitivity of the force sensor device.

The invention claimed is:

1. A force sensor, comprising:
   a base comprising at least one rigid boss and an outer wall,
   a cap attached to the base at a surface defined by the at least one rigid boss and the outer wall, wherein the cap and the base form a sealed cavity,
   at least one flexure formed in the base and around the at least one rigid boss to convert force applied to the cap into strain,
   a gap between the base and the cap that narrows with the application of the force to the cap such that the at least one flexure will not deform beyond its breaking point, and
   a sensor configured to sense strain on a bottom surface of the base.

2. The force sensor of claim 1, wherein the at least one flexure is formed in the base and around the at least one rigid boss by etching.

3. The force sensor of claim 1, wherein the sensor comprises at least one of a piezoresistive, piezoelectric, or capacitive transducer.

4. The force sensor of claim 1, wherein the sensor is configured to produce an electrical voltage, current, or charge signal proportional to the strain.

5. The force sensor of claim 1, further comprising a plurality of electrical terminals formed on the bottom surface of the base, wherein the electrical signal produced by the sensor is routed to the electrical terminals.

6. The force sensor of claim 5, wherein the electrical terminals comprise solder bumps.

7. The force sensor of claim 1, wherein the base further comprises grooves to focus mechanical strain on the at least one flexure.

8. The force sensor of claim 1, wherein the sealed cavity is formed by at least one surface adhered between the cap and the base.

9. The force sensor of claim 8, wherein the base further comprises a cavity formed by etching the at least one flexure, wherein the cavity is bounded by a surface of at least one of the at least one flexure, the at least one rigid boss, or the outer wall.

10. The force sensor of claim 9, wherein the cavity is bounded by a respective surface of each of the at least one flexure, the at least one rigid boss, and the outer wall.

11. The force sensor of claim 9, wherein the cavity is sealed between the base and the cap.

12. The force sensor of claim 11, wherein the cap comprises a contact surface and a surface opposite to the contact surface, and wherein the sealed cavity is further bounded by the surface opposite to the contact surface.

13. The force sensor of claim 8, wherein the sealed cavity is sealed from an environment external to the force sensor.

* * * * *